(12) United States Patent
Kim et al.

(10) Patent No.: US 8,618,635 B2
(45) Date of Patent: Dec. 31, 2013

(54) CAPACITORS IN INTEGRATED CIRCUITS AND METHODS OF FABRICATION THEREOF

(75) Inventors: Sunoo Kim, Hopewell Junction, NY (US); Moosung Chae, Poughkeepsie, NY (US); Bum Ki Moon, LaGrangeville, NY (US)

(73) Assignee: Infineon Technologies AG, Neubiberg (DE)

( * ) Notice: Subject to any disclaimer, the term of this patent is extended or adjusted under 35 U.S.C. 154(b) by 337 days.

(21) Appl. No.: 12/913,550

(22) Filed: Oct. 27, 2010

(65) Prior Publication Data

US 2012/0104552 A1  May 3, 2012

(51) Int. Cl.
*H01L 21/02* (2006.01)

(52) U.S. Cl.
USPC ............ 257/535; 257/532; 257/307; 257/534

(58) Field of Classification Search
USPC .......................................... 257/535, 532, 307
See application file for complete search history.

(56) References Cited

U.S. PATENT DOCUMENTS

| | | | |
|---|---|---|---|
| 5,939,766 A * | 8/1999 | Stolmeijer et al. | 257/534 |
| 2008/0128859 A1 * | 6/2008 | Chen et al. | 257/534 |
| 2008/0239619 A1 * | 10/2008 | Okamoto et al. | 361/303 |

* cited by examiner

*Primary Examiner* — Michael Lebentritt
*Assistant Examiner* — Aaron Dehne
(74) *Attorney, Agent, or Firm* — Slater & Matsil, L.L.P.

(57) ABSTRACT

In one embodiment, a capacitor includes a first via level having first metal bars and first vias, such that the first metal bars are coupled to a first potential node. The first metal bars are longer than the first vias. Second metal bars and second vias are disposed in a second via level, the second metal bars are coupled to the first potential node. The second metal bars are longer than the second vias. The second via level is above the first via level and the first metal bars are parallel to the second metal bars. Each of the first metal bars has a first end, an opposite second end, and a middle portion between the first and the second ends. Each of the middle portions of the first metal bars and the second ends of the first metal bars do not contact any metal line.

36 Claims, 15 Drawing Sheets

CAPACITORS IN INTEGRATED CIRCUITS AND METHODS OF FABRICATION THEREOF

TECHNICAL FIELD

The present invention relates generally to semiconductor devices, and more particularly to capacitors in integrated circuits and methods of fabrication thereof.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

Capacitors are elements that are used in semiconductor devices for storing an electrical charge. Capacitors essentially comprise two conductive plates separated by an insulating material. When an electric current is applied to a capacitor, electric charges of equal magnitude yet opposite polarity build up on the capacitor plates. The capacitance, or the amount of charge held by the capacitor per applied voltage, depends on a number of parameters, such as the area of the plates, the distance between the plates, and the dielectric constant value of the insulating material between the plates, as examples. Capacitors are used in applications such as electronic filters, analog-to-digital converters, memory devices, control applications, and many other types of semiconductor device applications.

What are needed in the art are improved capacitors in semiconductor devices and methods of fabricating thereof.

SUMMARY OF THE INVENTION

In accordance with an embodiment of the present invention, a capacitor comprises a first via level that comprises first metal bars and first vias. The first metal bars is coupled to a first potential node. The first metal bars are longer than the first vias. A second via level comprises second metal bars and second vias. The second metal bars are coupled to the first potential node. The second metal bars are longer than the second vias. The second via level is above the first via level, and the first metal bars are parallel to the second metal bars. Each of the first metal bars has a first end, an opposite second end, and a middle portion between the first and the second ends. Each of the middle portions of the first metal bars and the second ends of the first metal bars do not contact any metal line.

In accordance with an alternative embodiment of the present invention, a capacitor comprises first metal bars disposed in a first via level. The first metal bars are coupled to a first potential node. Second metal bars are disposed in a second via level. The second metal bars are coupled to the first potential node. The second via level are above the first via level, and the first metal bars are parallel to the second metal bars. An insulating layer is disposed in a metal line level between the first metal bars and the second metal bars. The first metal bars and the second metal bars are not coupled through a metal line disposed directly between the first metal bars and the second metal bars.

In accordance with alternative embodiment of the invention, a semiconductor structure comprises a first via level comprising first metal bars and first vias, the first metal bars having a longer length than the first vias. The semiconductor structure further comprises a second via level comprising second metal bars and second vias. The second via level is above the first via level. The first metal bars and the second metal bars are both oriented along a first direction. The second metal bars have a longer length along the first direction than the second vias. The first metal bars and the second metal bars are laterally offset in a second direction perpendicular to the first direction.

In accordance with an alternative embodiment of the present invention, a method of fabricating a semiconductor device comprises depositing a first insulating layer over a workpiece. First metal bars are formed in the first insulating layer over a first region of the workpiece. A second insulating layer is formed over the first insulating layer. Metal lines are formed within the second insulating layer. The metal lines are formed over a second region of the workpiece and not directly over the first metal bars. The method further comprises forming a third insulating layer over the second insulating layer. Second metal bars are formed in the third insulating layer over the first region of the workpiece.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes FIGS. 1a-1d, a capacitor in accordance with an embodiment of the invention, wherein FIG. 1a illustrates a top view and wherein

FIG. 2, which includes FIGS. 2a-2d, a capacitor in accordance with an embodiment of the invention, wherein FIG. 2a illustrates a top view and wherein

FIG. 3, which includes FIGS. 3a and 3b, illustrates a embodiment of the capacitor, wherein FIG. 3a illustrates a top view and FIG. 3b illustrates a cross sectional view;

FIG. 4, which includes 4a and 4b, illustrates a capacitor in accordance with another embodiment of the invention, wherein

FIG. 5, which includes FIGS. 5a-5c, illustrates an embodiment of the capacitor, wherein FIG. 5a illustrates a top view and FIGS. 5b and 5c illustrates a cross sectional view;

FIG. 6, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

Figure 1A:
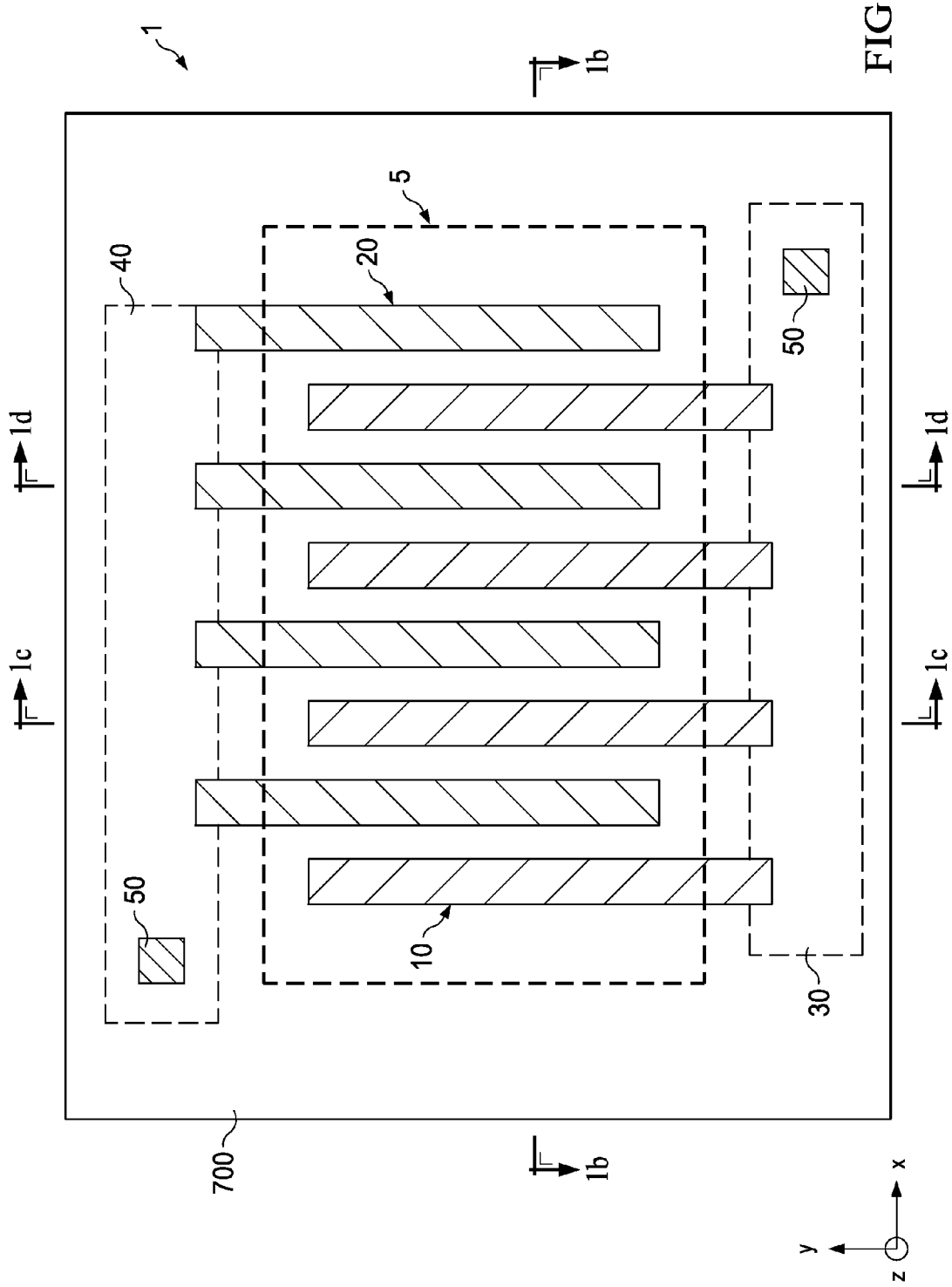

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the invention may be implemented in various semiconductor applications such as memory devices, logic devices, analog devices, power devices, radio frequency (RF) devices, digital devices, and other applications that utilize capacitors, for example.

Some properties of capacitors are a function of size. For example, a larger amount of energy or charge may be stored by a capacitor by increasing the (surface area) size of the capacitor plates. In some semiconductor device applications, it is desirable to increase the capacitance of capacitors, but area on the integrated circuit is often limited. Thus, what are needed in the art are improved capacitors and methods of manufacturing thereof that more efficiently use the area of the integrated circuit.

One type of capacitor used in semiconductor devices is referred to as a metal-insulator-metal (MIM) capacitor, which has capacitor plates formed parallel to a horizontal surface of a wafer, and a dielectric material formed between the capacitor plates. Another type of capacitor used in semiconductors is a vertical parallel plate (VPP) capacitor, wherein metal lines are formed in stacks and are connected together by vias. The stacked metal lines and vias are separated from a laterally adjacent vertical capacitor plate by a dielectric material to form a capacitor.

Vertical parallel plate capacitors, especially with technology scaling, suffer from reduced reliability due to misalignment in the lithography processes used to form the vias between the stacked metal lines, which results in high electrical fields proximate the metal lines. The high electrical fields may cause early dielectric breakdown, e.g., in reliability tests. In some metallization schemes that utilize copper as a material for the metal lines and vias, which has a high mobility and tends to diffuse into some dielectric materials, liners are used to prevent copper diffusion. However, vias of conventional vertical parallel plate capacitors comprise a minimum feature size for the semiconductor device, and due to the small size of the vias, liners formed within the vias may be thin or incompletely formed, resulting in leakage current between the vias of the vertical capacitor plates, which further degrades the reliability of the capacitors.

These and other problems are generally solved or circumvented, and technical advantages are generally achieved, by embodiments of the present invention, which comprise novel vertical parallel plate capacitor structures that are formed in multiple via levels of semiconductor devices. The capacitor plates of the capacitors comprise metal bars which improves reliability of the capacitors and increases capacitance density.

A structural embodiment of the invention will be described using FIG. 1. Further structural embodiments of the capacitor will be described using FIGS. 2-5 and 7. Embodiments of methods of fabricating the capacitor structure will be described with respect to FIG. 6.

Figure 1B:
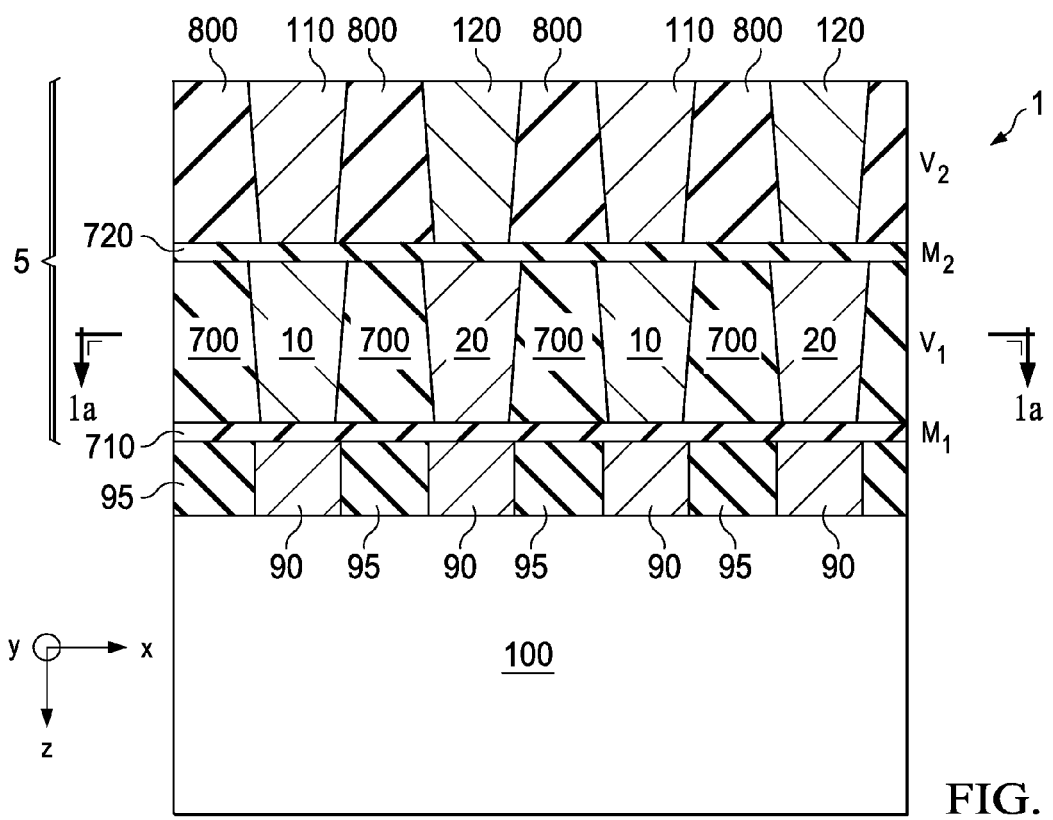
FIGS. 1b-1d illustrate cross-sectional views.
Figure 1C:
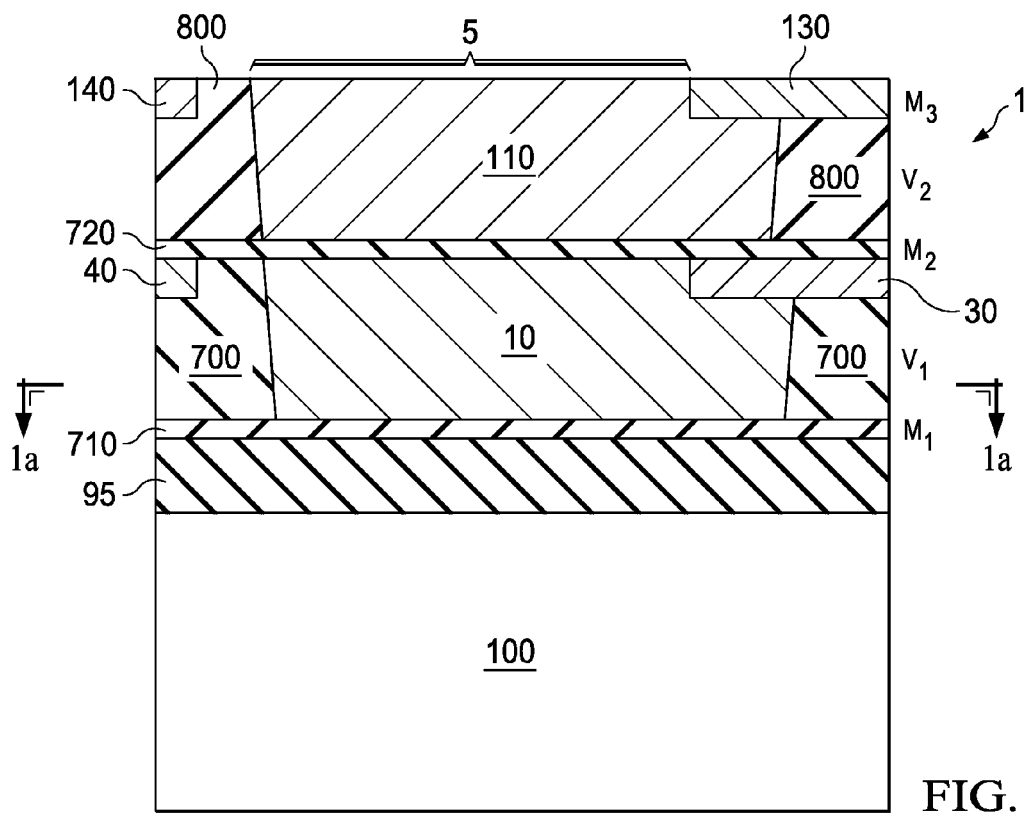
Figure 1D:
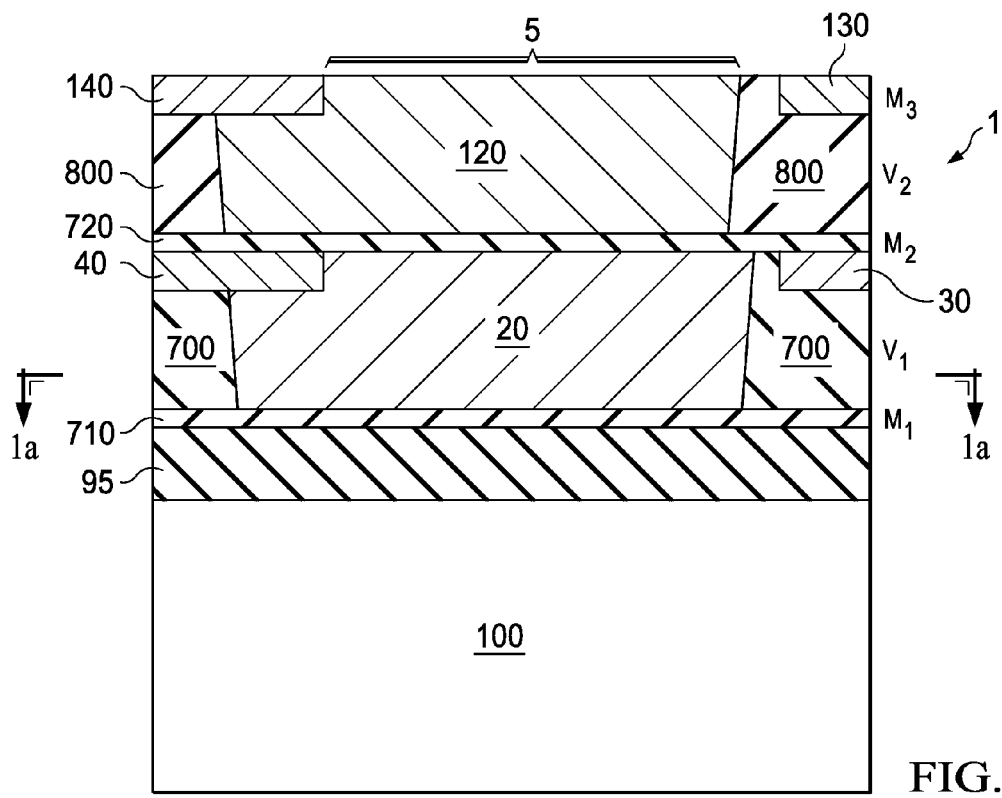

FIG. 1, which includes FIGS. 1a-1d, a capacitor in accordance with an embodiment of the invention, wherein FIG. 1a illustrates a top view and wherein FIGS. 1b-1d illustrate cross-sectional views.

Referring first to FIG. 1a, a capacitor 5 formed in a first region 1 of a workpiece. The capacitor 5 comprises first metal bars 10 and second metal bars 20 formed in an alternating manner. In various embodiments, the capacitor 5 comprises a finger structure having multiple fingers. Thus, except for the edges, each finger within the capacitor 5 is capacitively coupled with an adjacent finger in both (+/−x-axis) lateral directions.

Embodiments of the invention avoid using metal lines for the capacitive structure. Therefore, the capacitance is obtained by the capacitive coupling between the first metal bars 10 and the second metal bars 20. The capacitance is increased by adding further via levels having a similar structure.

Each via level is coupled to other via levels through metal lines which are outside the capacitive area of the capacitor. For example, first metal line 30 is coupled to one end of the first metal bars 10, and a second metal line 40 is coupled to one end of the second metal bars 20. The first and the second metal lines 30 and 40 may be coupled to metal lines in upper and lower metal levels through vias, for example, first vias 50.

As illustrated in the cross sectional view of FIG. 1b, the capacitor 5 includes at least two via levels: a first via level $V_1$ and a second via level $V_2$. Further via levels having a similar structure may be included in various embodiments.

As illustrated in FIG. 1b, the capacitor is formed over a substrate 100 within and over a plurality of conductive material layers: a first metal level $M_1$, a first via level $V_1$, a second metal level $M_2$, and a second via level $V_2$. The capacitor 5 may be formed over devices in some embodiments, and may include metal lines and/or vias underneath. In FIG. 1b, as an illustration, contact plugs 90 embedded in an insulating layer 95 are disposed below the capacitor.

Referring to FIGS. 1b-1c, the first metal bars 10 and second metal bars 20 are disposed within a first level insulating layer 700. In various embodiments, the first level insulating layer 700 comprises metal lines and vias over other regions, such as device region, which will be discussed as region 2 in FIG. 7. Similarly, third metal bars 110 and fourth metal bars 120 are disposed within a second level insulating layer 800. The first level insulating layer is separated from a lower level insulating layer by a first capping layer 710. The first and the second level insulating layers 700 and 800 are separated by a second capping layer 720.

As illustrated in FIG. 1c, the first metal bars 10 are not coupled to the third metal bars 110 in the capacitive region of the capacitor 5. As illustrated, the ends of the first metal bars 10 are coupled to a first metal line 30, and the ends of the third metal bars 110 are coupled to a third metal line 130. The first metal bars 10 may be coupled to the third metal bars 110 through the first metal line 30 and the third metal line 130, which are coupled through a second via 150 (which may be over first via 50 in FIG. 1a).

Similarly, as illustrated in FIG. 1d, the ends of the second metal bars 20 are coupled to a second metal line 40, and the ends of the fourth metal bars 120 are coupled to a fourth metal line 140. The second metal bars 20 may be coupled to the fourth metal bars 120 through the second metal line 40 and the fourth metal line 140, which are coupled through another second via 150 (which may be over first via 50 in FIG. 1a).

As illustrated in the cross sectional views of FIGS. 1b-1d, the first metal bars 10 are isolated from the third metal bars 110 by a first capping layer 710. Similarly, the second metal bars 20 are isolated from the fourth metal bars 120 by a second capping layer 720. In various embodiments, the first and the second capping layers 710 and 720 may comprise an insulating layer such as silicon carbide, nitrogen doped silicon carbide, and other suitable materials.

The embodiments described with respect to FIGS. 3-7 may use either this embodiment (FIG. 1) or the embodiments described with respect to FIG. 2 for the metal bar structure.

Using this embodiment of FIG. 1 (relative to embodiment of FIG. 2) advantageously helps to use the same metal line mask in patterning the metal bars.

In various embodiments, the metal bars including the first, second metal bars 10 and 20 are at least 10 times longer than the corresponding vias in the via level (such as first vias 50). In some embodiments, the metal bars are at least 20 times longer than the corresponding vias in the via level.

Advantageously, misalignment issues are avoided because the first metal bars 10 and the second metal bars 20 overlap a substantial portion of the metal lines.

Figure 2B:
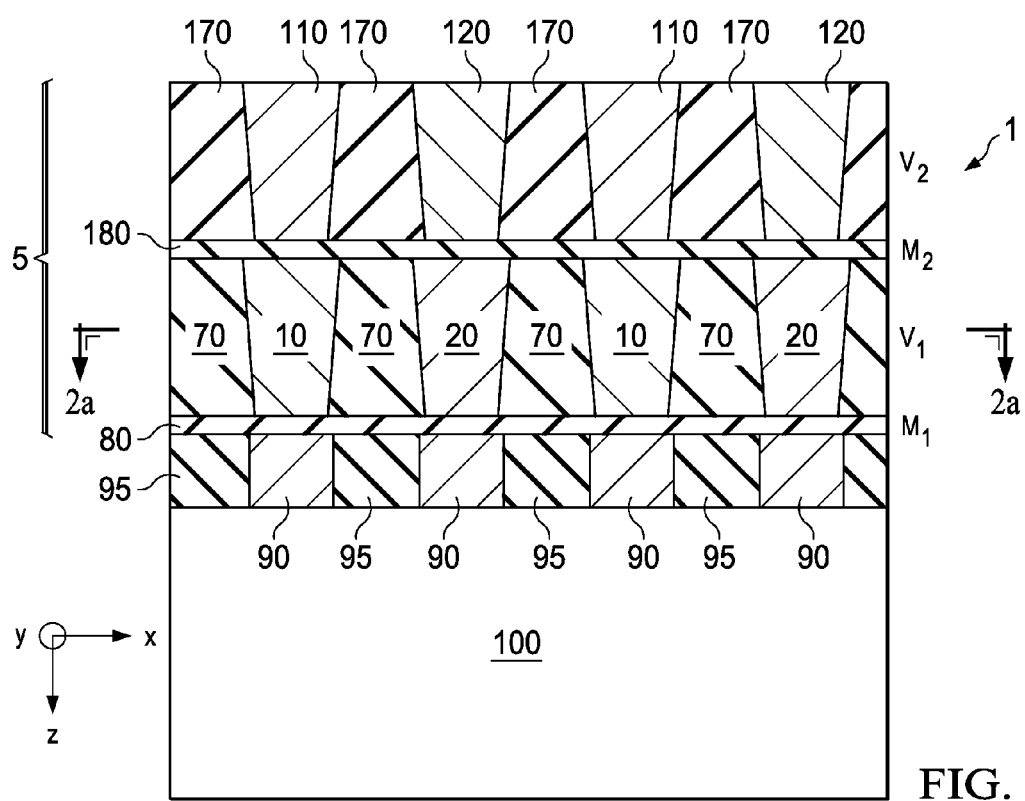
FIGS. 2b-2d illustrate cross-sectional views.
Figure 2A:
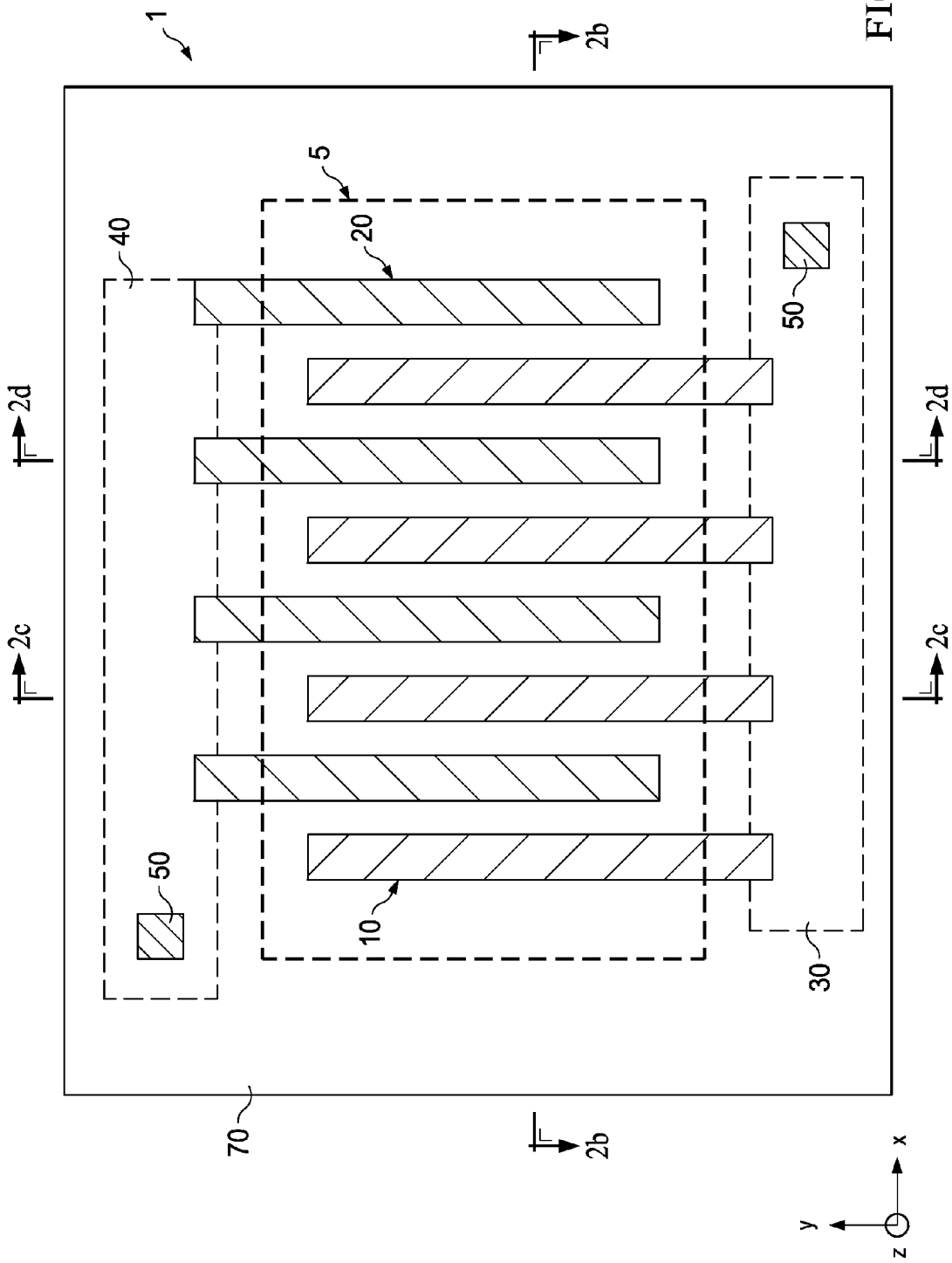
Figure 2C:
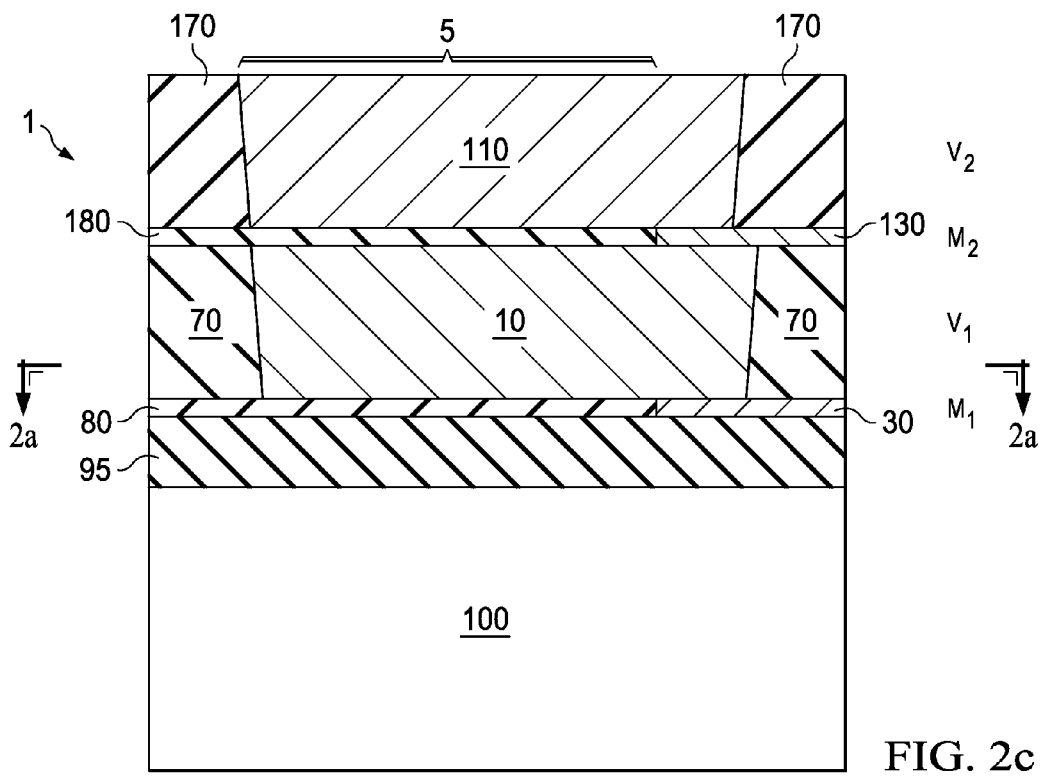
Figure 2D:
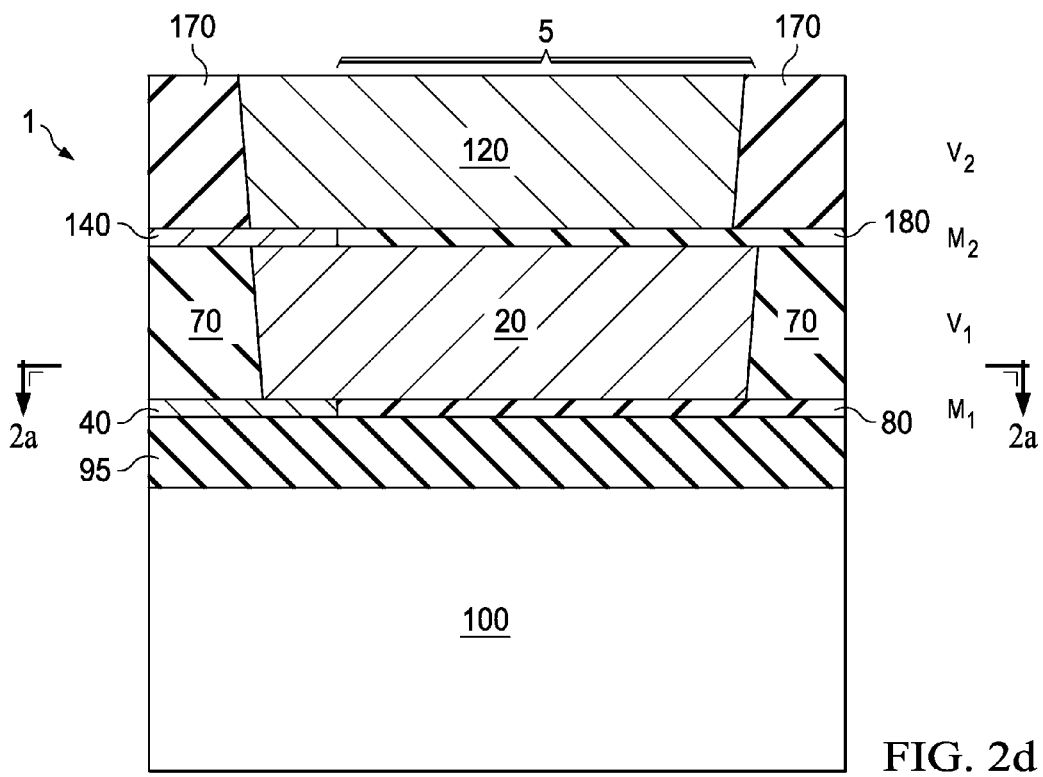

FIG. 2, which includes FIGS. 2a-2d, a capacitor in accordance with an embodiment of the invention, wherein FIG. 2a illustrates a top view and wherein FIGS. 2b-2d illustrate cross-sectional views.

This embodiment is different from the embodiment of FIG. 1 in that the metal bars are formed within only via levels and not within both metal and via levels.

Therefore, a top view of the capacitive structure in accordance with this embodiment is similar to that illustrated in FIG. 1a. However, the cross sectional views are different from prior embodiment of FIG. 1.

Referring to FIG. 2b, a first via level insulating layer 70 is disposed over a first metal level insulating layer 80. FIG. 2b illustrates that the first metal bars 10 and the second metal bars 20 are disposed in the first via level insulating layer 70.

A second metal level insulating layer 180 is disposed over the first via level insulating layer 70. A second via level insulating layer 170 is disposed over the second metal level insulating layer 80. The capacitor 5 further includes third metal bars 110 and fourth metal bars 120 disposed in the second via level insulating layer 170.

In various embodiments, there are no metal lines directly between a first capacitor region formed by the first and the second metal bars 10 and 20 and a second capacitor region formed by the third and the fourth metal bars 110 and 120.

FIG. 2c illustrates the contacting of the capacitor in accordance with one embodiment of the invention.

In one or more embodiments, although the first metal bars 10 are not coupled to the third metal bars 110 in the capacitive region of the capacitor 5, the ends of the first metal bars 10 may be coupled to the ends of the third metal bars 110. In FIG. 2c, a first metal line 30 is disposed under the first metal bars 10. A third metal line 130 is disposed between the first metal bars 10 and the third metal bars 110.

Similarly, as illustrated in FIG. 2d, although the second metal bars 20 are not coupled to the fourth metal bars 120 in the capacitive region of the capacitor 5, the ends of the second metal bars 20 may be coupled to ends of the fourth metal bars 120. In FIG. 2d, a second metal line 40 is disposed in the first metal level $M_1$ under the second metal bars 20. A fourth metal line 140 is disposed between the second metal bars 20 and the fourth metal bars 120.

Figure 3A:
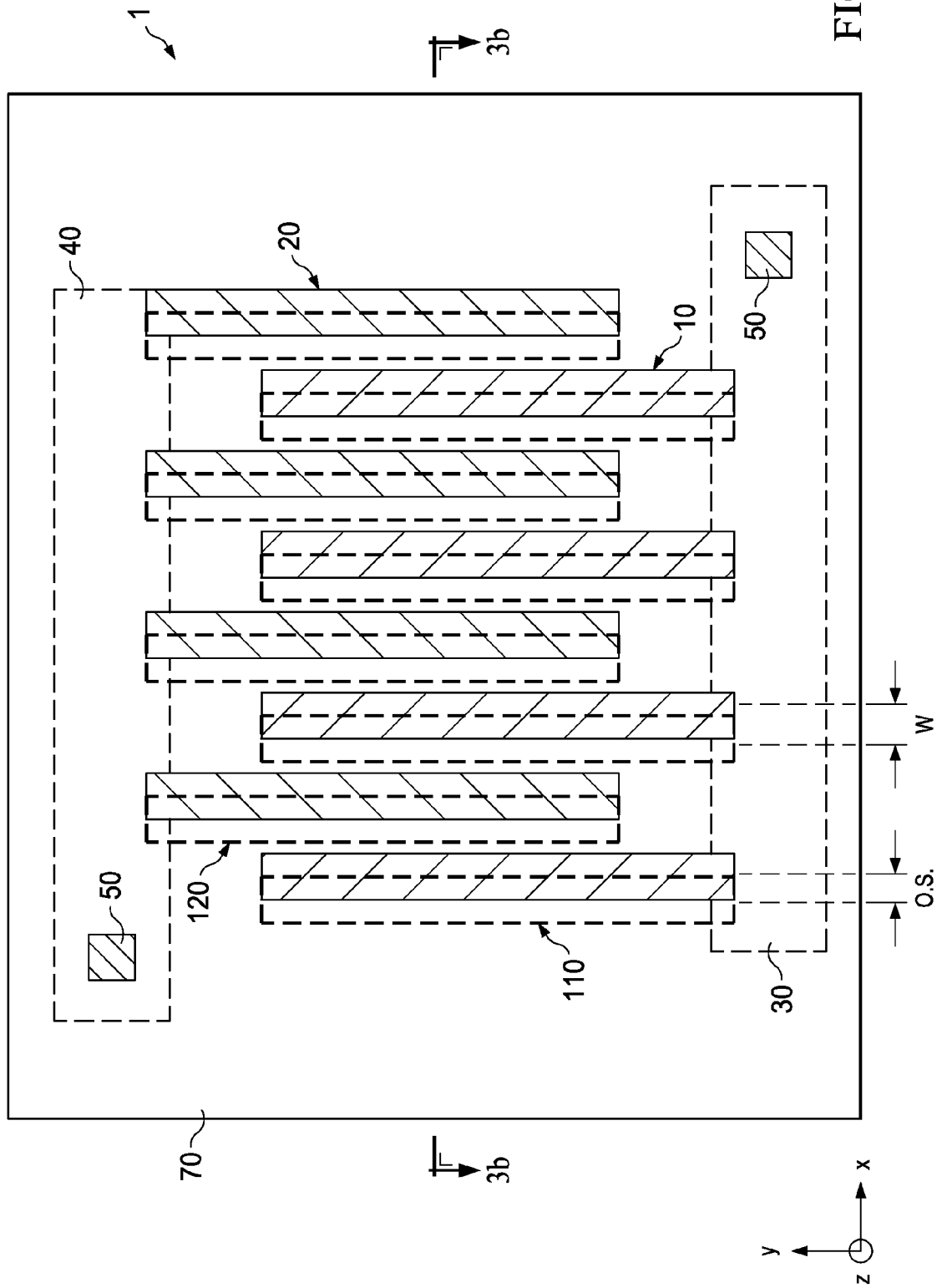
Figure 3B:
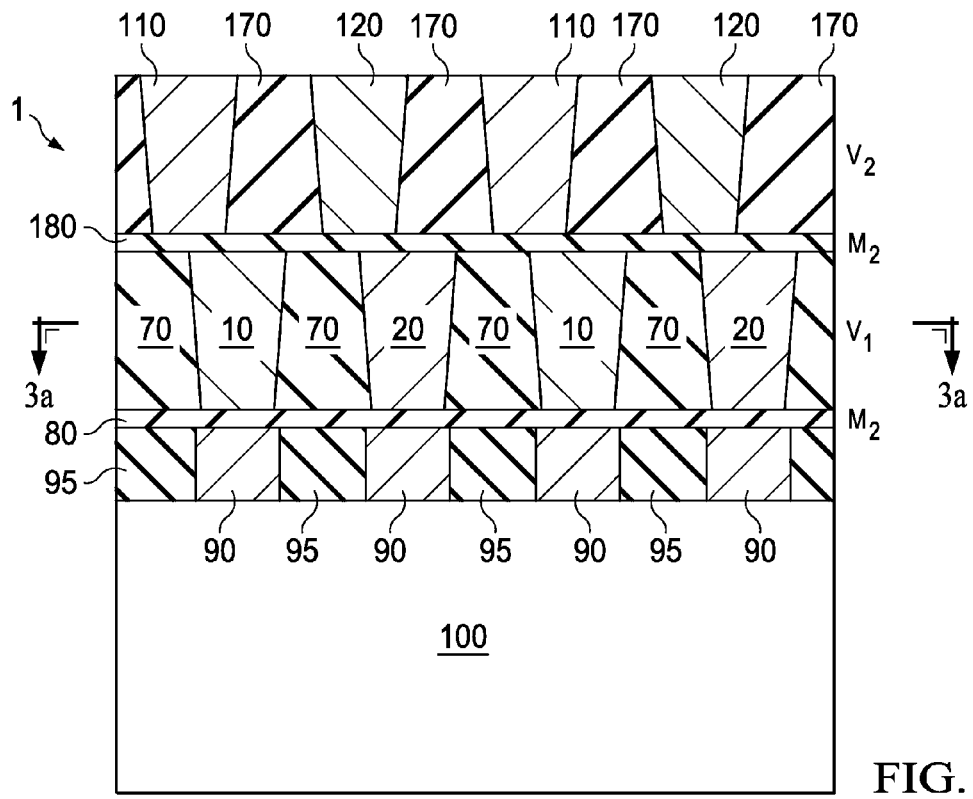

FIG. 3, which includes FIGS. 3a and 3b, illustrates an embodiment of the capacitor, wherein FIG. 3a illustrates a top view and FIG. 3b illustrates a cross sectional view.

Referring to FIG. 3a, in various embodiments, capacitors within each via level may be misaligned. In other words, the metal bars within each via level are not aligned. This is acceptable because the capacitor in each via level do not physically contact the capacitor at the next via level. For example, as illustrated, first metal bars 10 may not underlie third metal bars 110, and second metal bars 20 may not underlie fourth metal bars 120. Rather, the first metal bars 10 are offset laterally (along the x-axis) relative to the third metal bars 110 by a distance O.S. Similarly, the second metal bars 20 are offset relative to the fourth metal bars 120. The distance O.S. may be about 5% of the width of the metal bars W in one embodiment. In various embodiments, the distance O.S. may be between about 5% to about 20% of the width of the metal bars W.

Advantageously, this avoids complicated and difficult process control. The misalignment does not impact the functioning of the capacitor unlike a conventional VPP capacitor that requires precise alignment to avoid breaking electrical connection between the various metal levels.

Figure 4B:
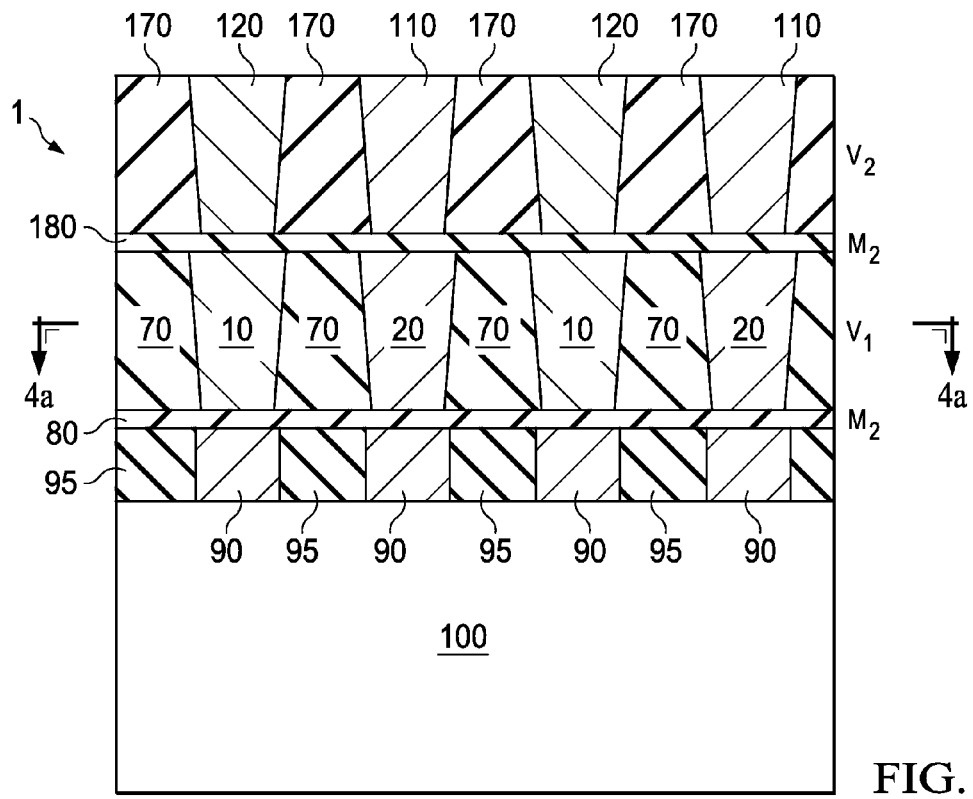
FIG. 4a illustrates a top view and FIG. 4b illustrates a cross sectional view.
Figure 4A:
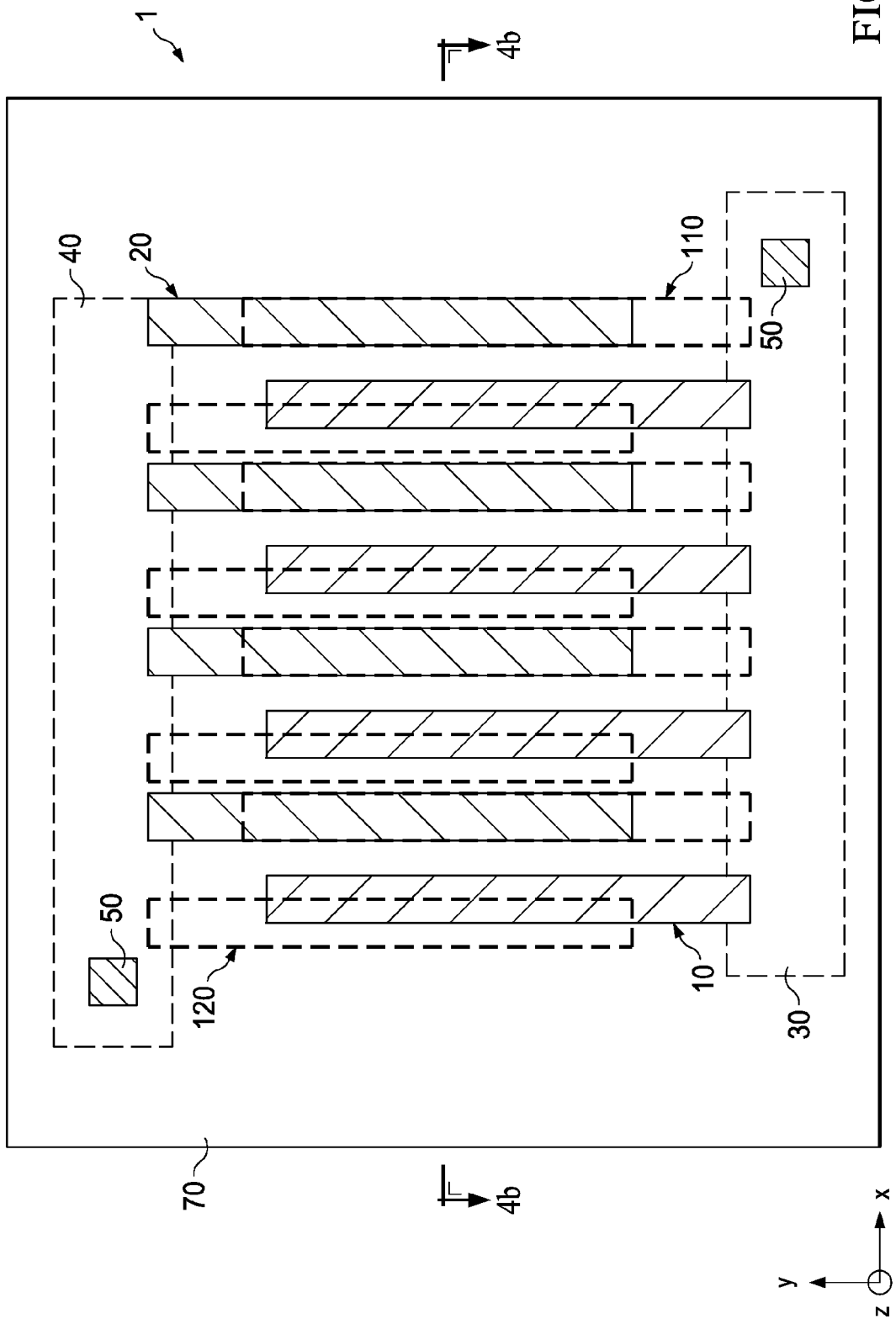

FIG. 4, which includes 4a and 4b, illustrates a capacitor in accordance with another embodiment of the invention, wherein FIG. 4a illustrates a top view and FIG. 4b illustrates a cross sectional view.

This embodiment is similar to the embodiment of FIG. 3 in that the capacitors in each via level are not aligned. Further, as illustrated in FIGS. 4a and 4b, the third metal bars 110 may directly overlie second metal bars 20, and fourth metal bars 120 may directly overlie first metal bars 10. Besides horizontal capacitive coupling as in prior embodiments, in this embodiment, each via level is also vertically capacitively coupled to the capacitor in the upper or lower via level thereby increasing the total capacitance.

Care must be taken to maintain the integrity of the insulating layers separating the metal bars in the different levels to prevent shorting or dielectric breakdown.

Figure 5A:
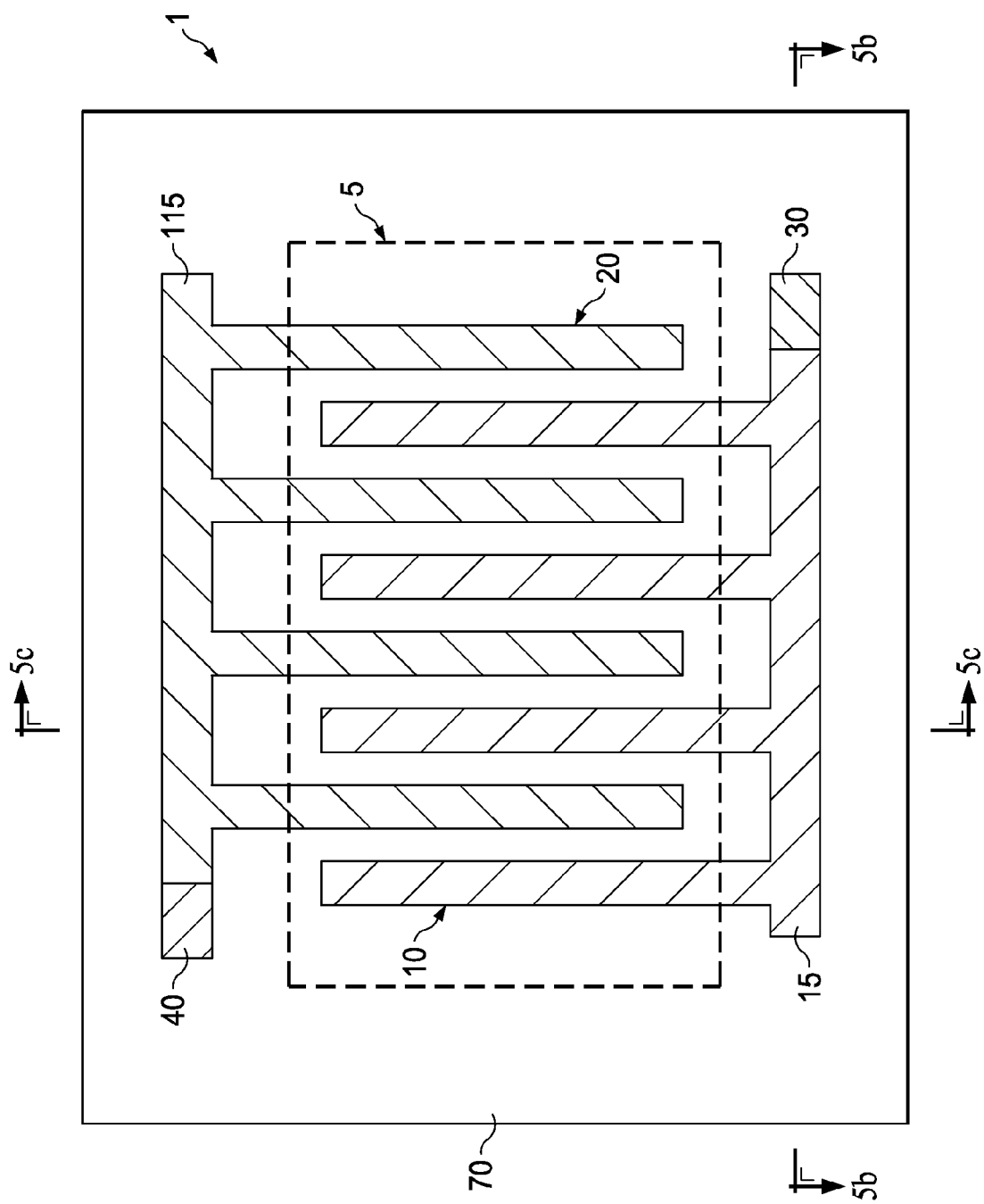
Figure 5B:
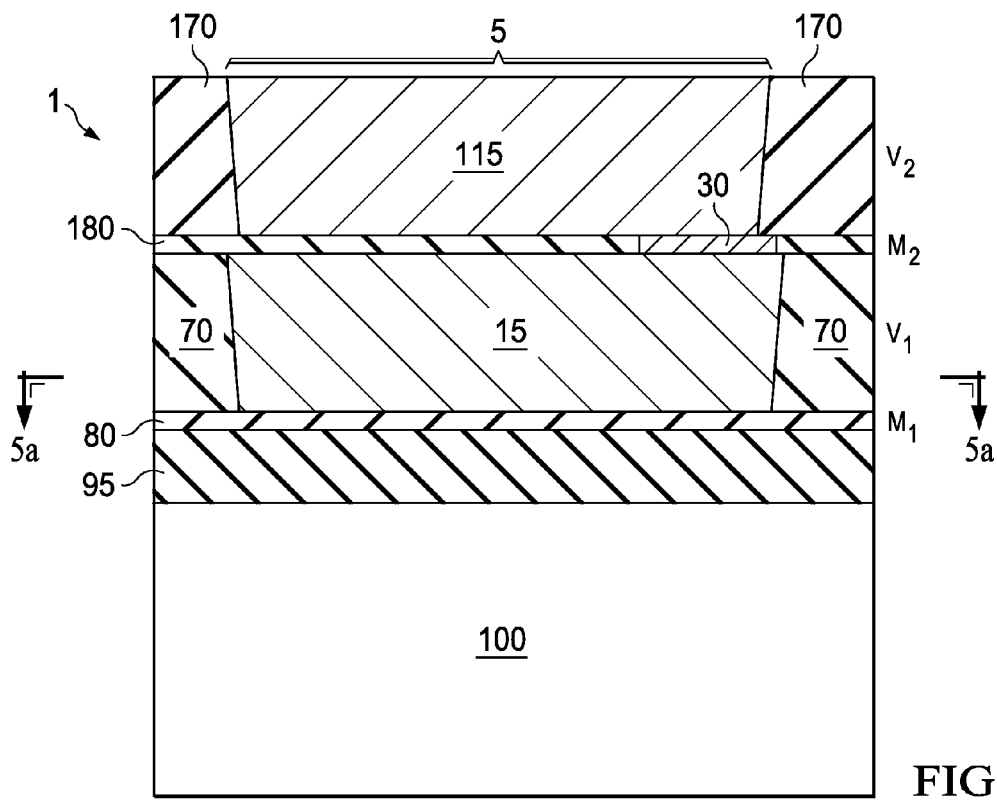
Figure 5C:
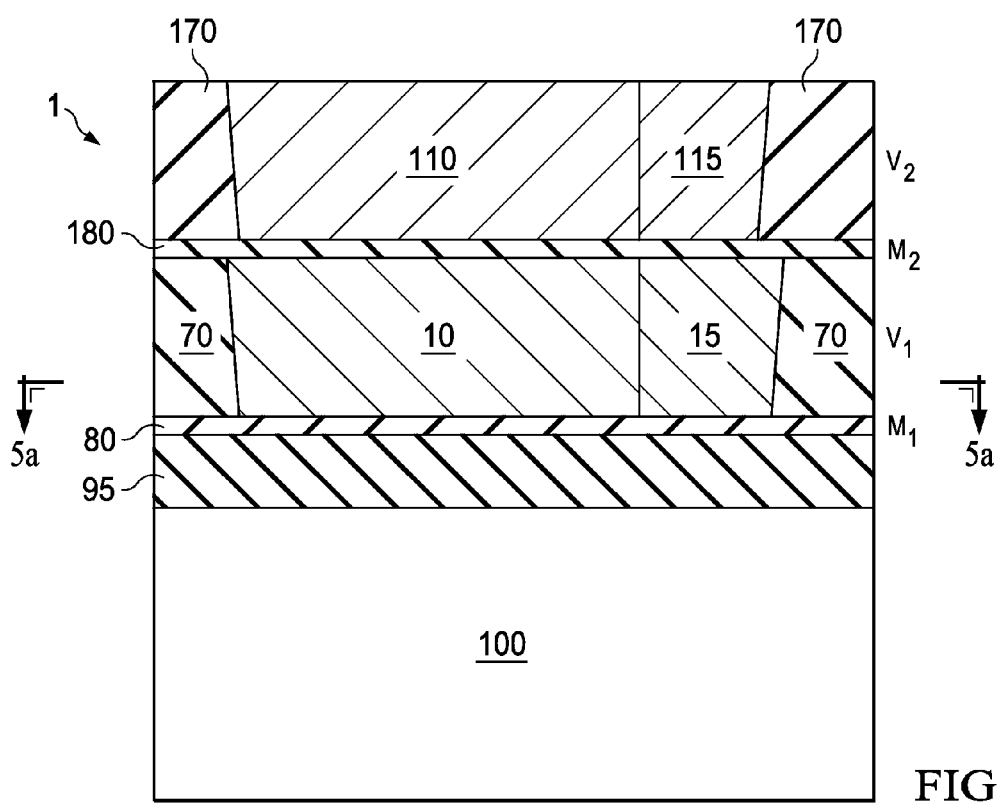

FIG. 5, which includes FIGS. 5a-5c, illustrates an embodiment of the capacitor, wherein FIG. 5a illustrates a top view and FIGS. 5b and 5c illustrates a cross sectional view.

In this embodiment, the ends of the metal bars are not coupled to the metal lines. Rather, as illustrated in FIG. 5a, a first common metal bar 15 is connected to the ends of the first metal bars 10, and a second common metal bar 25 is connected to the ends of the second metal bars 20. The first common metal bar 15 is coupled to a first metal line 30, which may be coupled to another common metal bar in a different via level.

As illustrated in FIG. 5b, the first common metal bar 15 is coupled to a third metal line 130 in a second metal level $M_2$. A third common metal bar 115 in the second via level $V_2$ is coupled to the third metal line 130. The third common metal bar 115 may be coupled to corresponding third metal bars 110 (as described in prior embodiments). Similarly, the second common metal bar 25 is coupled to a second metal line 40, which may be coupled to another common metal bar in a different via level.

Again this embodiment avoids any misalignment issues because the common metal bars overlap a large portion of the metal lines.

FIG. 6, which includes FIGS. 6a-6h, illustrates a semiconductor device in various stages of processing in accordance with embodiments of the invention.

Figure 6A:
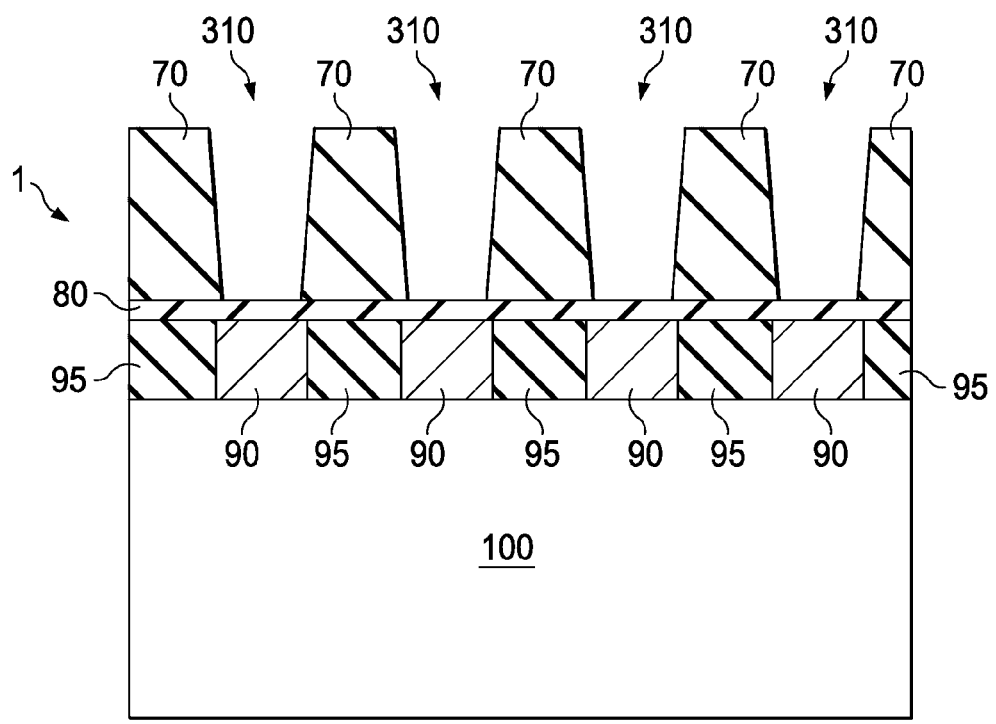
FIGS. 6a-6h, illustrates a semiconductor device in various stages of processing in accordance with embodiments of the invention.

Referring to FIG. 6a, a substrate 100 is provided. The substrate 100 may include a semiconductor substrate comprising silicon or other semiconductor materials covered by an insulating layer, for example. The substrate 100 may also include other active components or circuits, not shown. The substrate 100 may comprise silicon oxide over single-crystal silicon, for example. The substrate 100 may include other conductive layers or other semiconductor elements, e.g., transistors, diodes, etc., not shown. Compound semiconductors, GaAs, InP, Si/Ge, or SiC, as examples, may be used in place of silicon. The substrate 100 may comprise a silicon-on-insulator (SOI) substrate, for example.

Various device regions are formed within the substrate 100 during front end of the line processing. The device regions include transistors, diodes, capacitors, and other devices. During this stage, regions of the transistors such as well regions, source/drain regions, gate oxide, gate lines are fabricated.

Contact plugs 90 are next formed within an insulating layer 95 to contact with the device regions. A first metal level insulating layer 80 is deposited on the insulating layer 95. The first metal level insulating layer 80 may comprise an oxide such as $SiO_2$, a nitride such as $Si_3N_4$, a low-k dielectric material. The first metal level insulating layer 80 may be formed using chemical vapor deposition (CVD), atomic layer deposition (ALD), metal organic chemical vapor deposition (MOCVD), physical vapor deposition (PVD), a spin-on process, or jet vapor deposition (JVD), as examples, although alternatively, other methods may also be used.

Metal lines may be formed within the first metal level insulating layer 80 over other regions of the substrate 100. In various embodiments, metal lines are not formed within the first metal level insulating layer 80 in the capacitive regions of the capacitor (being formed).

A first via level insulating layer 70 is deposited over the first metal level insulating layer 80. In one embodiment, a etch stop layer (not shown) is first deposited on the first metal level insulating layer 80, and the first via level insulating layer 70 is deposited on the etch stop layer. The first via level insulating layer 70 may comprise an oxide and/or other low-k dielectric materials.

Metal bar openings 310 are next formed in the first via level insulating layer 70 as shown in FIG. 5a. In various embodiments, while forming metal bar openings 310, openings for forming vias are also formed. In various embodiments, the metal bar openings 310 may be formed by depositing masking layer and patterning using lithography. Subsequently, the patterns are etched within the first via level insulating layer 70 to form the metal bar openings 310.

Figure 6B:
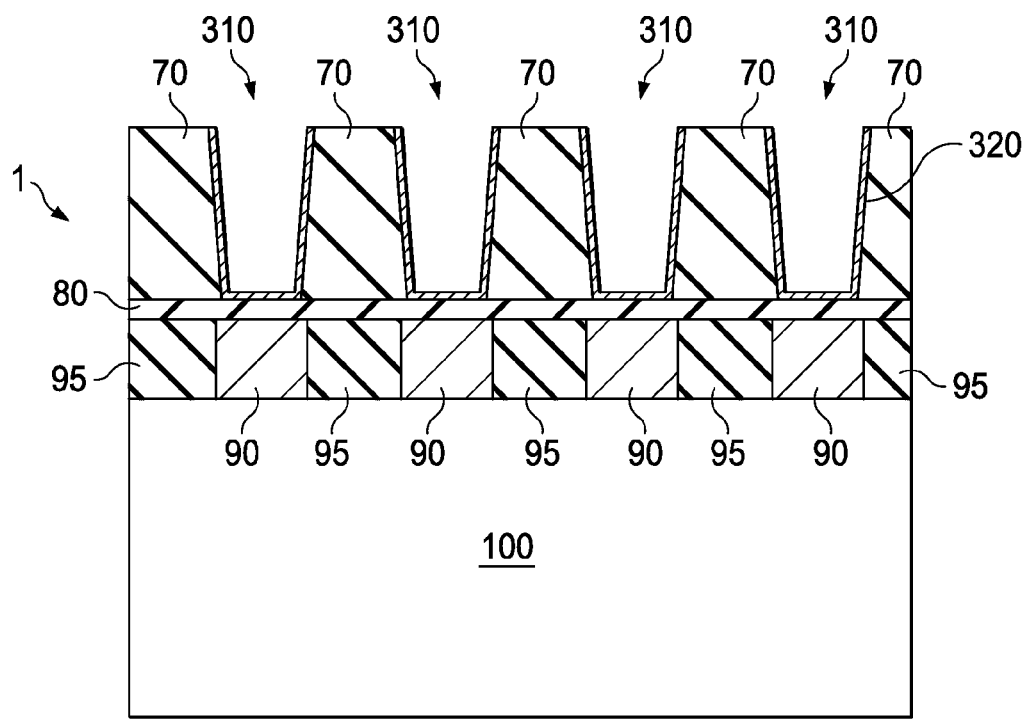

Referring next to FIG. 6b, the metal bar openings 310 are lined with metal liner 320. The metal liner 320 may be a diffusion barrier as well as an adhesion promoting layer in various embodiments. The metal liner 320 may comprise Ta, TaN, WN, WCN, Ru, Ti, TiN, TiSiN, other materials, or combinations thereof. An optional seed layer may be deposited over the metal liner 320. The metal liner 320 may be formed using deposition processes such as PVD, ALD, or CVD in various embodiments.

Figure 6C:
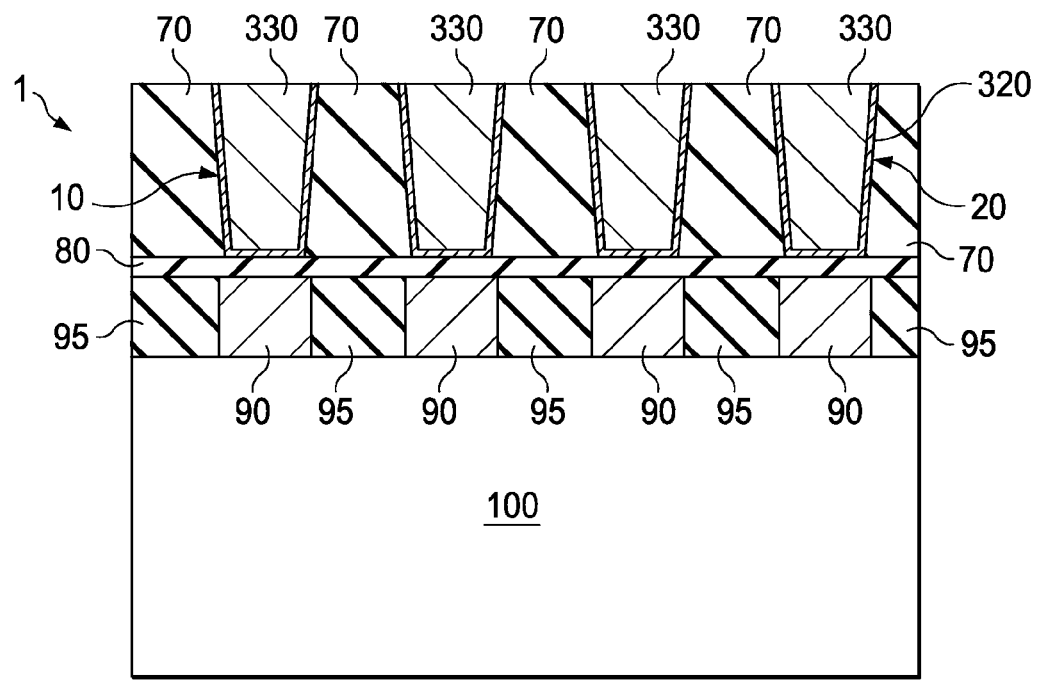

As illustrated in FIG. 6c, the metal bar openings 310 are next filled with a fill metal 330, for example, using an electrochemical deposition process. The fill metal 330 may comprise Al, Cu, W, Ag, other metals, a semiconductive material, or combinations thereof, as examples. The fill metal 330 is next planarized using, for example, a chemical mechanical planarization process.

FIGS. 6d-6g illustrate alternative embodiments during the processing of the semiconductor device.

Figure 7:
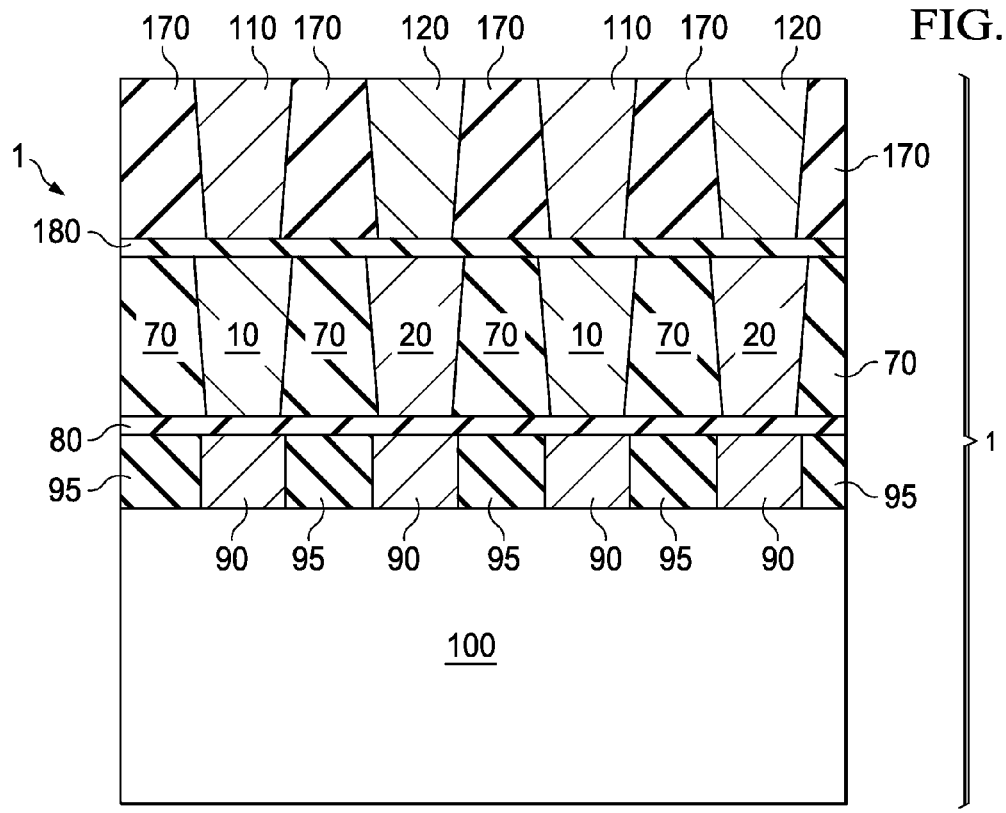
FIG. 7 illustrates an embodiment of the invention wherein the capacitor is formed in a first region of a workpiece and wherein other devices are formed in a second region of the workpiece.
Figure 7:
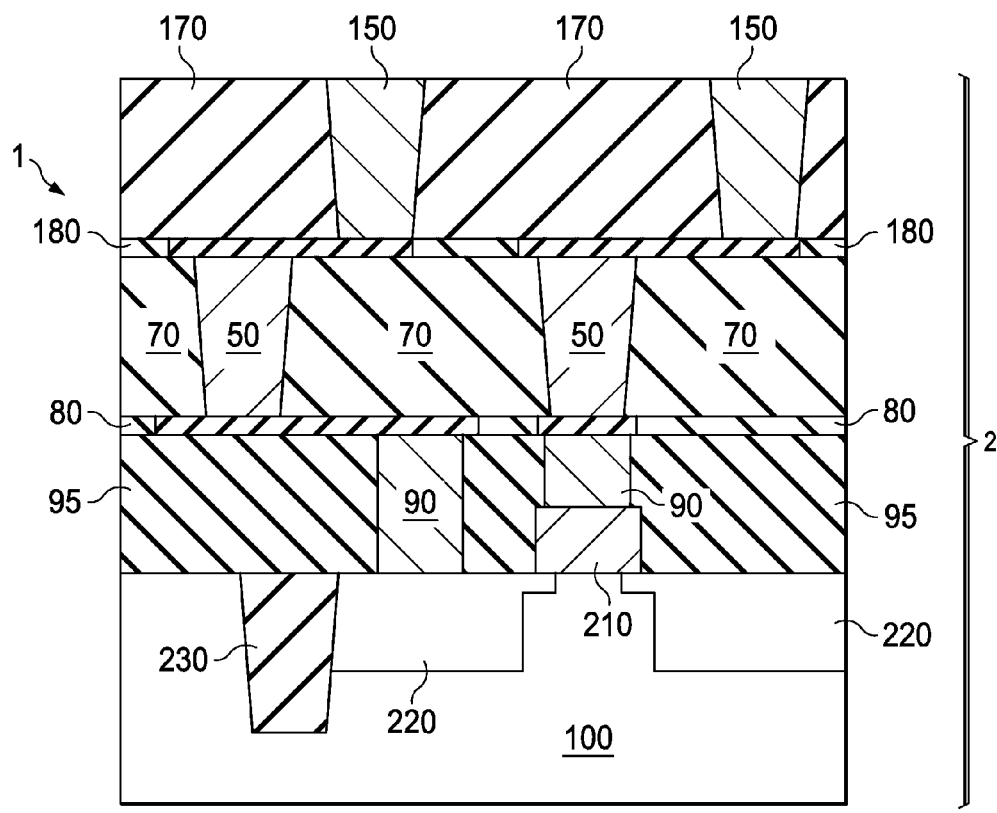

In this embodiment, after filling the metal bar openings 310 with the fill metal 330, at least a portion of the first via level insulating layer 70 is etched. Only the portion of the first via level insulating layer 70 in the first region 1 (forming the capacitor 5) is removed forming capacitor dielectric openings 71. The portions of the first via level insulating layer 70 over the device regions, e.g., region 2 in FIG. 7, are protected with a mask during the etching.

Figure 6D:
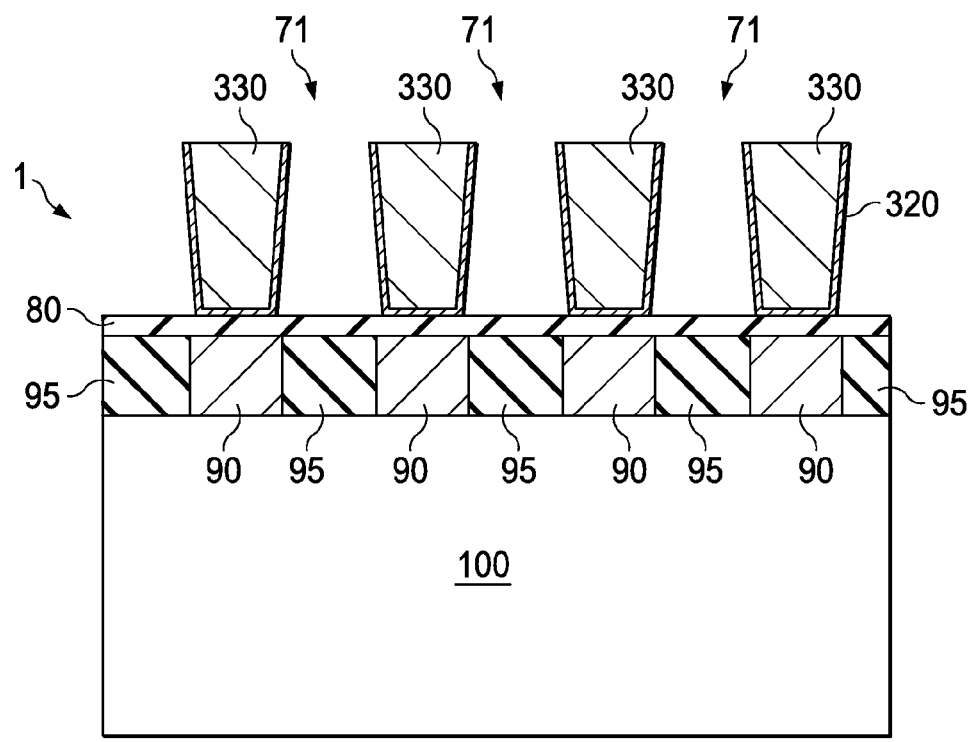

In one embodiment, an isotropic etch is used to remove essentially all of the first via level insulating layer 70 (FIG. 6d).

Next, a high-k dielectric material 340 is filled into the capacitor dielectric openings 71. The addition of the high-k dielectric material 340 increases the coupling between the capacitor plates thereby advantageously increasing the capacitance. Thus, the capacitor plates, e.g., first metal bars 10 and second metal bars 20 are separated by a high-k dielectric material 340. In one embodiment, the high-k dielectric material 340 is silicon nitride. In other embodiments, other suitable materials may be used.

Figure 6E:
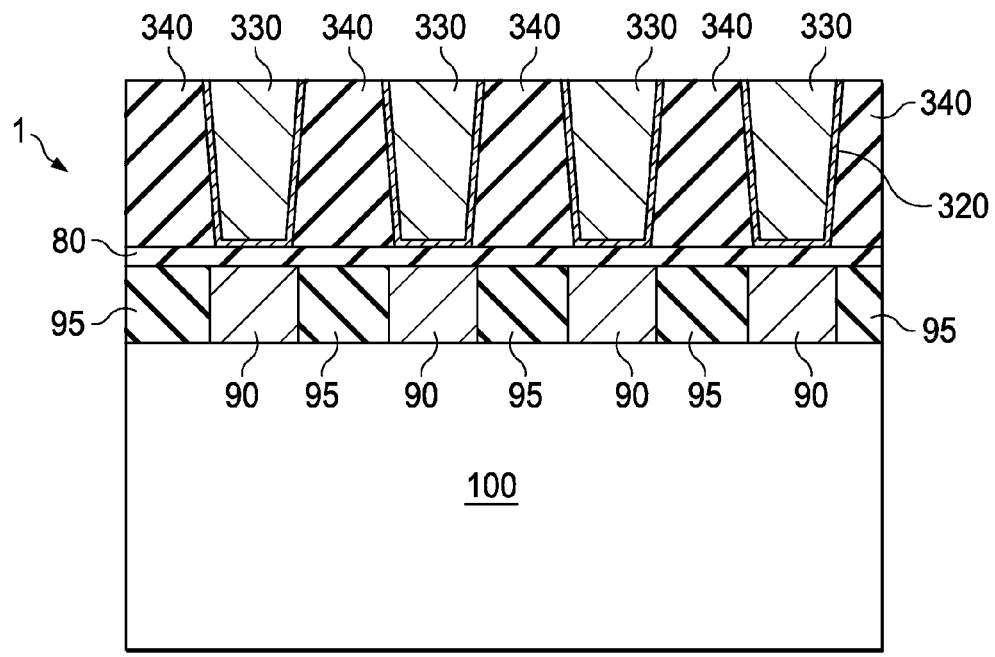

FIG. 6e illustrates the embodiment wherein essentially all of the first via level insulating layer 70 is removed and filled with the high-k dielectric material 340.

Figure 6F:
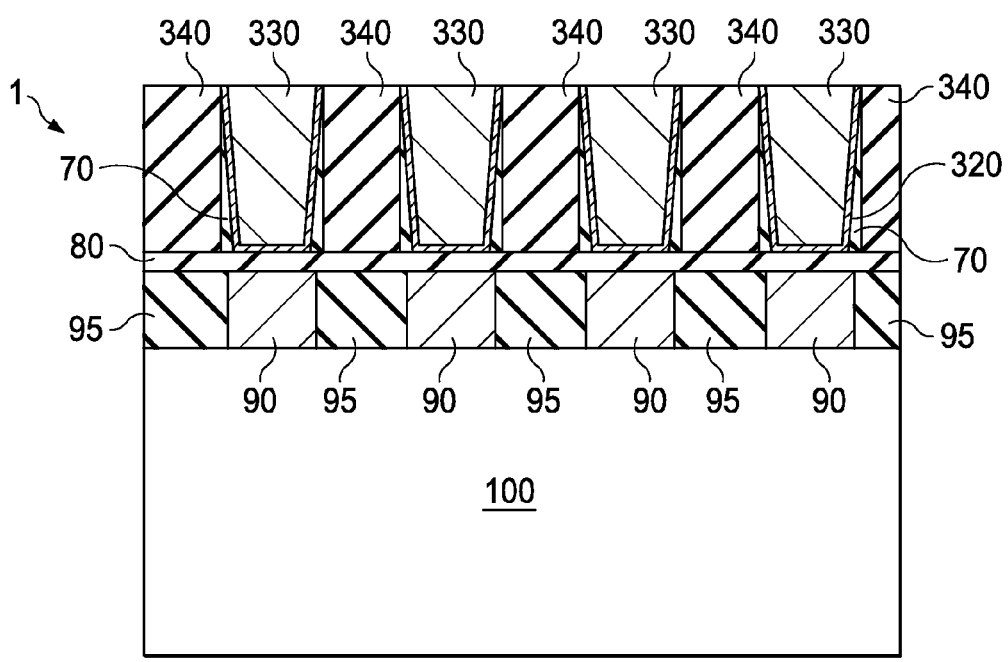

FIG. 6f illustrates an alternative embodiment, in which, an anisotropic etch is used to etch the first via level insulating layer 70. Therefore, a portion of the first via level insulating layer 70 around the metal bars 50 may remain after the etching process. A thin spacer containing the material of the first via level insulating layer 70 is present around the metal bars. The capacitor after being filled with the high-k dielectric material 340 is illustrated in FIG. 6f.

Figure 6G:
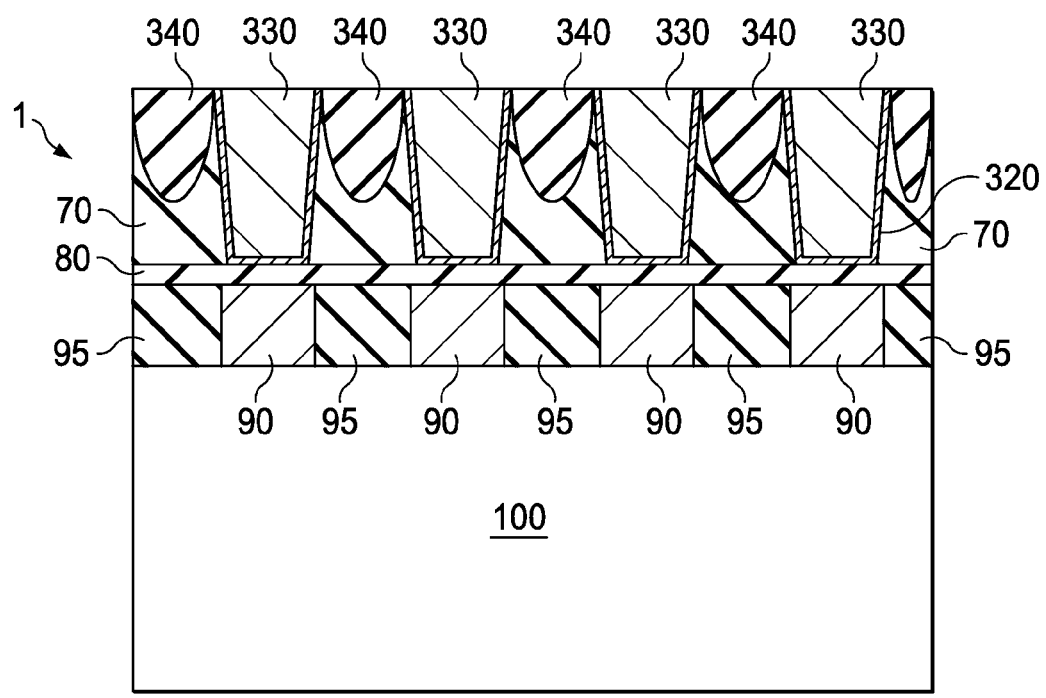
Figure 6H:
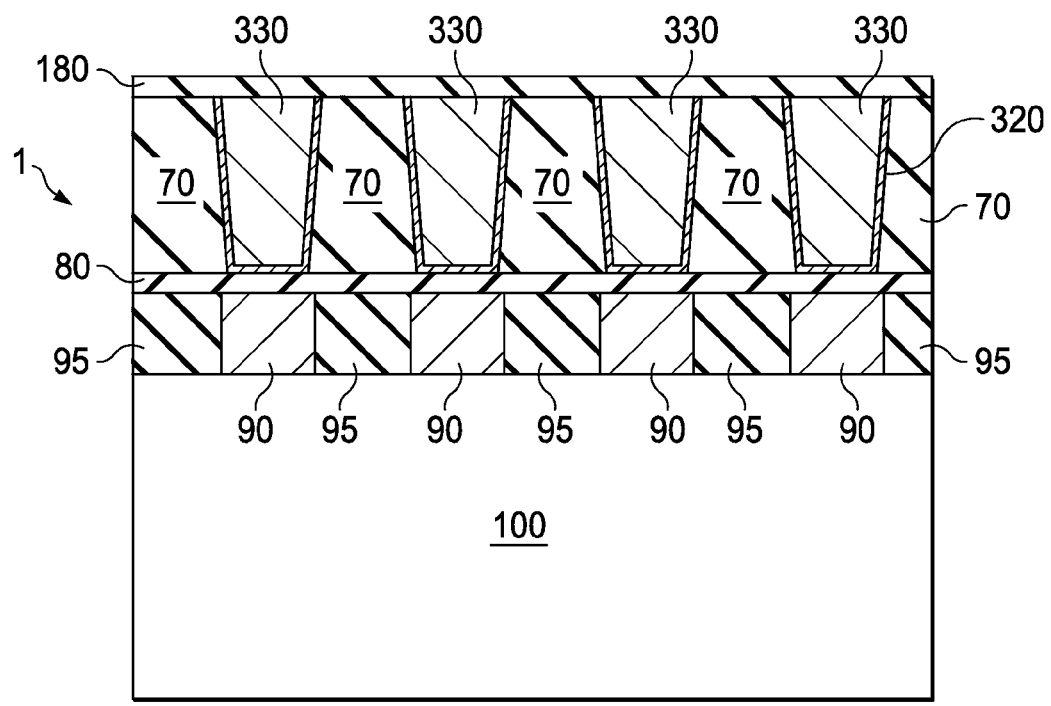

In another embodiment, a timed etch may be used to remove a portion of the first via level insulating layer 70. Thus a portion of the capacitor dielectric between the first metal bars 10 and second metal bars comprises the high-k dielectric material 340 as illustrated in FIG. 6g.

Subsequent processing of further capacitor layers may follow similar steps as described above for the first metal and via levels. E.g., a second metal level insulating layer 180 is deposited over the first via level insulating layer 70 and the metal bars in the second via level may be formed over the second metal level insulating layer 180 as described above. In various embodiments, more than two via levels may be used to form the vertical plate capacitor.

FIG. 7 illustrates an embodiment of the invention wherein the capacitor is formed in a first region 1 of a workpiece. The capacitor may have any structure as described with respect to FIGS. 1-5. The workpiece further comprises a second region 2, which may further comprise other circuitry. As an example, the workpiece comprises a transistor having a gate electrode 210, source/drain regions 220 formed within or over the substrate 100. The transistors may be isolated by isolation regions 230.

As illustrated, contact plugs 90 disposed within the insulating layer 95 couple the transistor to metallization, through which, the transistor is coupled to other devices, as well as, external potentials. First vias 50 in the first via level $V_1$ are embedded within the first via level insulating layer 70. Second vias 150 in the second via level $V_2$ are embedded within the second via level insulating layer 170.

In various embodiments, first vias 50 are formed using a common process as the first metal bars 10 and the second metal bars 20. Similarly, in various embodiments, second vias 150 are formed using a common process as the third metal bars 110 and the fourth metal bars 120.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A capacitor comprising:
   a first via level comprising first metal bars and first vias, the first metal bars being coupled to a first potential node, the first metal bars having a longer length than the first vias, wherein a bottom surface of the first metal bars is coplanar with a bottom surface of the first vias; and
   a second via level comprising second metal bars and second vias, the second metal bars coupled to the first potential node, the second via level being above the first via level, the second metal bars having a longer length than the second vias, wherein the first metal bars are parallel to the second metal bars, wherein each of the first metal bars has a first end, an opposite second end, and a middle portion between the first and the second ends, and wherein each of the middle portions of the first metal bars and the second ends of the first metal bars do not contact any metal line.

2. The capacitor of claim 1, wherein the first ends of the first metal bars contact a first metal line in a first metal level.

3. The capacitor of claim 1, wherein each of the second metal bars has a first end, an opposite second end, and a middle portion between the first and the second ends, wherein each of the middle portions of the second metal bars and the second ends of the second metal bars do not contact any metal line.

4. The capacitor of claim 3, wherein each of the first ends of the first metal bars contact a second metal line in a second metal level, and wherein each of the first ends of the second metal bars contact the second metal line.

5. The capacitor of claim 4, wherein each of the first ends of the first metal bars is coupled to each of the first ends of the second metal bars through the second metal line.

6. The capacitor of claim 3, wherein each of the first ends of the first metal bars contact a third metal bar disposed in the first via level, the third metal bar oriented perpendicular to the first metal bars.

7. The capacitor of claim 6, wherein each of the first ends of the second metal bars contact a fourth metal bar disposed in the second via level, the fourth metal bar oriented perpendicular to the second metal bars.

8. The capacitor of claim 7, further comprising a metal line disposed in a second metal level contacting the third metal bar and the fourth metal bar.

9. The capacitor of claim 1, further comprising:
   third metal bars parallel to the first metal bars and disposed in the first via level, the third metal bars coupled to a second potential node, the third metal bars being capacitively coupled to the first metal bars, wherein each of the third metal bars has a first end, an opposite second end, and a middle portion between the first and the second ends, and wherein each of the middle portions of the third metal bars and the second ends of the third metal bars do not contact any metal line; and
   fourth metal bars parallel to the second metal bars and disposed in the second via level, the fourth metal bars being coupled to the second potential node.

10. The capacitor of claim 9, wherein the first and the second metal bars form a first plate of the capacitor, and wherein the third and the fourth metal bars form a second plate of the capacitor.

11. The capacitor of claim 9, further comprising a first capacitor region formed by the first metal bars and the third metal bars, and a second capacitor region formed by the second metal bars and the fourth metal bars, wherein no metal line is disposed between the first capacitor region and the second capacitor region.

12. The capacitor of claim 1, wherein the first metal bars are laterally offset from the second metal bars.

13. The capacitor of claim 1, wherein the first metal bars extend into a first metal level, and wherein the first metal bars have the same shape within the first via level and the first metal level.

14. The capacitor of claim 1, wherein the first metal bars do not extend into any metal level.

15. A capacitor comprising:
   first metal bars disposed in a first via level, the first metal bars being coupled to a first potential node;
   second metal bars disposed in a second via level, the second metal bars being coupled to the first potential node, the second via level being above the first via level, wherein the first metal bars are parallel to the second metal bars;
   a insulating layer between the first metal bars and the second metal bars, wherein the first metal bars and the second metal bars are not coupled through a metal line disposed directly between the first metal bars and the second metal bars; and
   a first metal level comprising a first metal line disposed in the insulating layer between the first via level and the second via level.

16. The capacitor of claim 15, further comprising:
   third metal bars disposed in the first via level, the third metal bars being coupled to a second potential node; and
   fourth metal bars disposed in the second via level, the fourth metal bars being coupled to the second potential node, the second via level being above the first via level, wherein the third metal bars are parallel to the fourth metal bars, wherein the third metal bars and the fourth metal bars are not coupled through a metal line disposed directly between them.

17. The capacitor of claim 16, wherein the first and the second metal bars form a first plate of the capacitor, and wherein the third and the fourth metal bars form a second plate of the capacitor.

18. The capacitor of claim 16, further comprising a first capacitor region formed by the first metal bars and the third metal bars, and a second capacitor region formed by the second metal bars and the fourth metal bars, wherein no metal line is disposed between the first capacitor region and the second capacitor region.

19. The capacitor of claim 15, wherein the first metal bars are parallel to the second metal bars, wherein each of the first metal bars has a first end, an opposite second end, and a middle portion between the first and the second ends, wherein each of the second metal bars has a first end, an opposite second end, and a middle portion between the first and the second ends, wherein each of the middle portions of the first metal bars and the second ends of the first metal bars do not contact any metal line, and wherein each of the middle portions of the second metal bars and the second ends of the second metal bars do not contact any metal line.

20. The capacitor of claim 19, further comprising:
a third metal bar perpendicular to the first metal bars, the third metal bar contacting each of the first ends of the first metal bars; and
a fourth metal bar perpendicular to the second metal bars, the fourth metal bar contacting each of the first ends of the second metal bars.

21. A semiconductor structure comprising:
a first via level comprising first metal bars and first vias, the first metal bars having a longer length than the first vias, wherein a bottom surface of the first metal bars is coplanar with a bottom surface of the first vias, and wherein a top surface of the first metal bars is coplanar with a top surface of the first vias; and
a second via level comprising second metal bars and second vias, the second via level being above the first via level, wherein the first metal bars and the second metal bars are both oriented along a first direction, wherein the second metal bars have a longer length along the first direction than the second vias, and wherein the first metal bars and the second metal bars are laterally offset in a second direction perpendicular to the first direction.

22. The semiconductor structure of claim 21, wherein no metal line is disposed between the first metal bars and the second metal bars.

23. The semiconductor structure of claim 21, wherein the offset is about 5% of a width of the first metal bars in the second direction.

24. The semiconductor structure of claim 21, wherein the offset is about 5% to about 20% of a width of the first metal bars in the second direction.

25. The capacitor of claim 9, wherein the first metal bars are vertically capacitively coupled to the fourth metal bars.

26. The capacitor of claim 9, wherein the fourth metal bars overlap the first metal bars, and wherein the third metal bars overlap the second metal bars.

27. The capacitor of claim 26, wherein the fourth metal bars completely overlap the first metal bars, and wherein the third metal bars completely overlap the second metal bars.

28. The capacitor of claim 9, wherein the fourth metal bars are laterally offset relative to the first metal bars and partially overlap the first metal bars, and wherein the third metal bars are laterally offset relative to the second metal bars and partially overlap the second metal bars.

29. The semiconductor structure of claim 21, wherein the first metal bars overlap the second metal bars, and wherein the first metal bars and the second metal bars are electrically coupled to a same potential node.

30. The semiconductor structure of claim 21, wherein the first metal bars overlap the second metal bars, and wherein the first metal bars are coupled to a first potential node and the second metal bars are coupled to a different second potential node.

31. A capacitor comprising:
a first via level comprising first metal bars and first vias, the first metal bars being coupled to a first potential node, the first metal bars having a longer length than the first vias;
a second via level comprising second metal bars and second vias, the second metal bars coupled to a different second potential node, the second via level being above the first via level, the second metal bars having a longer length than the second vias, wherein the first metal bars are parallel to the second metal bars, wherein each of the first metal bars has a first end, an opposite second end, and a middle portion between the first and the second ends, and wherein each of the middle portions of the first metal bars and the second ends of the first metal bars do not contact any metal line; and
a first metal level comprising a first metal line between the first via level and the second via level, wherein the first metal bars extend into the first metal level and contact the first metal line in the first metal level, and wherein the first metal bars have the same shape within the first via level and the first metal level.

32. The capacitor of claim 31, wherein the first metal bars partially overlap the second metal bars.

33. The capacitor of claim 31, wherein the first metal bars are laterally offset relative to the second metal bars.

34. The capacitor of claim 31, wherein the first metal bars completely overlap the second metal bars.

35. The capacitor of claim 1, wherein the first metal bars and the first vias are about the same height.

36. The capacitor of claim 1, further comprising a first metal level comprising a first metal line disposed between the first via level and the second via level.

* * * * *